US005922988A

United States Patent [19]

Nishimoto

[11] Patent Number: 5,922,988

[45] Date of Patent: Jul. 13, 1999

[54] THERMOELECTRIC MATERIAL

[75] Inventor: Seiji Nishimoto, Saitama, Japan

[73] Assignee: Honda Giken Kogyo Kabushiki Kaisha, Tokyo, Japan

[21] Appl. No.: 08/895,378

[22] Filed: Jul. 16, 1997

[30] Foreign Application Priority Data

Jul. 16, 1996 [JP] Japan .................................... 8-204167

[51] Int. Cl.[6] ............................ H01L 35/28; H01L 35/14; H01L 35/20; C04B 35/00

[52] U.S. Cl. .......................... 136/225; 136/227; 136/239; 136/240; 252/62.3 T

[58] Field of Search ................................ 136/236.1, 238, 136/239, 240, 224, 225, 227; 252/62.3 T

[56] References Cited

U.S. PATENT DOCUMENTS 5,436,467 7/1995 Elsner et al. .............................. 257/15

*Primary Examiner*—Kathryn Gorgos
*Assistant Examiner*—Thomas H. Parsons
*Attorney, Agent, or Firm*—Lyon & Lyon LLP

[57] ABSTRACT

A thermoelectric material which exhibits an excellent thermoelectric performance even when it is used at elevated temperatures is shown and described. A thermoelectric material is provided having conductive layers made of a first semiconductor only, and barrier layers made of a second semiconductor only, that are alternatingly formed one upon the other. The interface of the barrier layer relative to the conductive layer is roughly formed to include a plurality of protuberances and a plurality of recesses, and the interface of the conductive layer relative to the barrier layer is roughly formed to fit the interface of the barrier layer. The ratio Ry/t of the maximum height Ry of the protuberance on the barrier layer to the thickness t of the barrier layer is set to be $Ry/t \geqq 0.1$. This makes it possible to enhance the strength of the heterojunction interface between the barrier layer and the conductive layer and to improve the heat resistance.

3 Claims, 8 Drawing Sheets

2
4
a2
a1
b1
b2
3
s1
s2
4
s2
3
1
c
Ry
t
4

100nm

THERMOELECTRIC MATERIAL

FIELD OF THE INVENTION

The present invention relates to thermoelectric materials.

BACKGROUND OF THE INVENTION

There has heretofore been known thermoelectric materials of the type in which a heterojunction interface between a conductive layer and a barrier layer is formed into a flat atomic surface (see, for example, U.S. Pat. No. 5,436,467).

In the thermoelectric material, the energy gap in the barrier layer is maintained to be much wider than the energy gap in the conductive layer to create a large difference between the two energy gaps, whereby quantum wells are formed in the conductive layers. As a result, the electric conductivity of the thermoelectric material is heightened, and an improved thermoelectric performance is exhibited.

In order to strictly control the interfaces of the barrier layer and the conductive layer, therefore, the layers have heretofore been formed by the molecular beam epitaxial method (MBE), atomic epitaxial layer method (ALE) or the like method.

In a thermoelectric material of this type, however, there is a difference in the coefficient of thermal expansion between the barrier layer and the conductive layer, due to the difference in the crystalline structures of the semiconductors and the difference in the lattice constants. Therefore, when the heterojunction interface between the barrier layer and the conductive layer is formed into a flat atomic surface and then the temperature is elevated in order to maximize the thermoelectric performance of the thermoelectric material to its limit, a relatively large thermal stress is produced in the heterojunction interface. As a result, cracks are produced in the conductive layer and/or in the barrier layer due to the thermal stress, thereby breaking the thermoelectric material.

Furthermore, in order to form layers via the above-mentioned methods, very expensive equipment and very complex process control are required. In addition, despite the process control, the occurrence of defective products is high, resulting in an increase in the cost at which the thermoelectric materials are produced.

A need therefore exists for a thermoelectric material which has an excellent thermoelectric performance even when it is used at elevated temperatures, and which increases the productivity and lowers the cost of production. The present invention fulfills these needs, and provides further related advantages.

SUMMARY OF THE INVENTION

Briefly, the present invention provides a thermoelectric material which has an excellent thermoelectric performance even when used at elevated temperatures, and which is efficient and cost effective to produce. In a preferred embodiment, a thermoelectric material is provided, having conductive layers and barrier layers that are alternatingly formed one upon the other. The conductive layers are made of a first semiconductor only, and the barrier layers are made of a second semiconductor only, that is different from the first semiconductor. The interface of the barrier layer relative to the conductive layer is roughly formed to include a plurality of protuberances and a plurality of recesses, the interface of the conductive layer relative to the barrier layer is roughly formed to fit the interface of the barrier layer, and the ratio Ry/t is $\geqq 0.1$, where Ry is the maximum height of the protuberance on the barrier layer and t is the thickness of the barrier layer.

The layers of the thermoelectric material are formed by sputtering which is a generally employed method of forming thin films. The surface (interface) of the barrier layer is rough, including a plurality of recesses and protuberances formed by sputtering.

When a heterojunction interface is created by forming a conductive layer on the barrier layer, it is believed that the below-mentioned phenomenon occurs.

That is, crystals in the conductive layer tend to grow in such a way that the orientation of crystals in the conductive layer agrees with that in the barrier layer. In the recesses and protuberances, therefore, an atom of the barrier layer tends to overlap with an atom of the conductive layer. In fact, however, it is impossible for two atoms to exist, overlapping with each other. Therefore, the atoms move to neutral positions where they do not overlap with each other, and other surrounding atoms undergo displacement, too. Thus, strain of the order of atoms occurs in the crystalline structure at the heterojunction interface between the barrier layer and the conductive layer, and atoms are restricted at the heterojunction interface. That is, even when an external force acts on the heterojunction interface between the barrier layer and the conductive layer, atoms hardly move at the heterojunction interface. This means that the interfacial strength is enhanced between the barrier layer and the conductive layer.

Therefore, if the ratio Ry/t of the maximum height Ry of the protuberances of the barrier layer to the thickness t of the barrier layer is set to be $Ry/t \geqq 0.1$, it is possible to increase the strain and to sufficiently enhance the interfacial strength. Accordingly, even when used at high temperatures, the thermoelectric material overcomes a relatively large thermal stress that generates near the heterojunction interface, and exhibits an excellent thermoelectric performance without being broken.

Moreover, since the layers are formed by a generally employed method of forming thin films, the thermoelectric material is efficiently produced at a low cost.

DETAILED DESCRIPTION OF THE INVENTION

Figure 1:
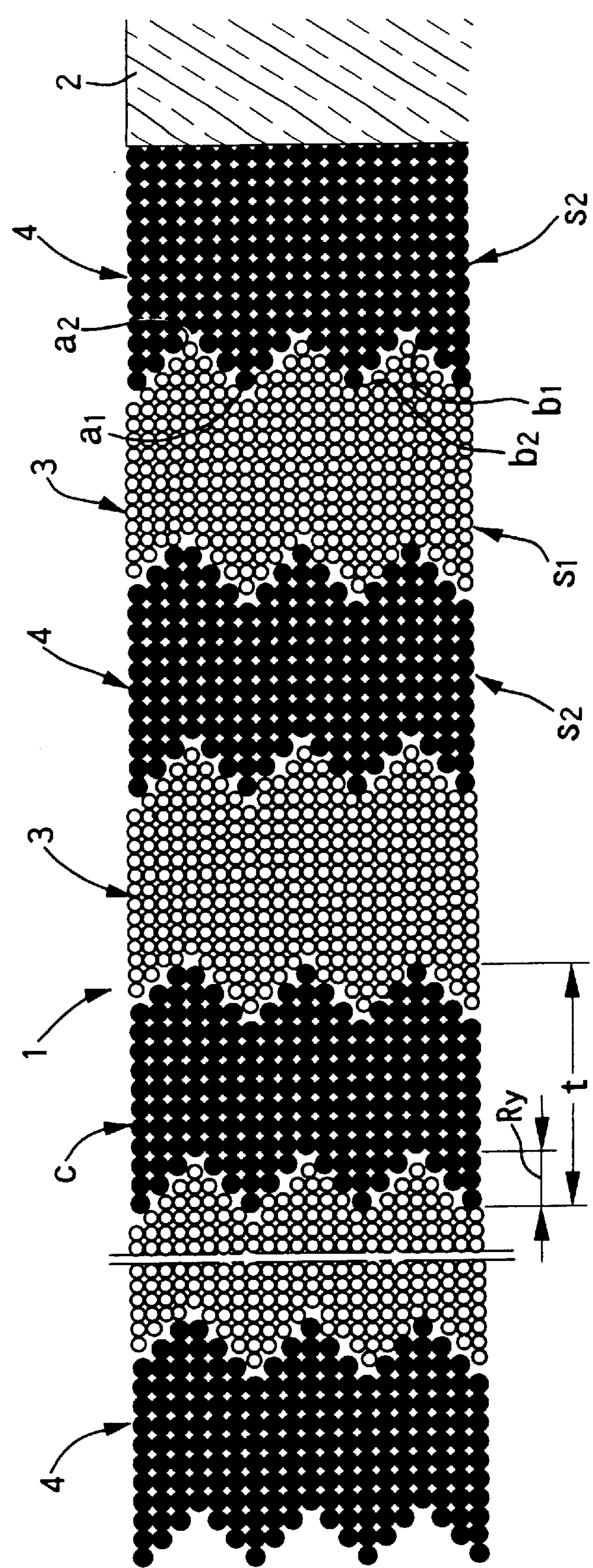
FIG. 1 is a diagram illustrating a thermoelectric material provided in accordance with a preferred embodiment of the present invention.

As illustrated in FIG. 1, a thermoelectric material 1 is formed in accordance with a preferred embodiment of the present invention on a substrate 2, having very thin film-like conductive layers 3 alternatingly formed with very thin film-like barrier layers 4. The conductive layers 3 are made of a first semiconductor $s_1$ only, and the barrier layers are made of a second semiconductor $s_2$ only, that is different from the first semiconductor $s_1$.

The interface of the barrier layer 4 relative to the conductive layer 3 is roughly formed to include a plurality of protuberances $a_1$ and recesses $b_1$. The interface of the conductive layer 3 relative to the barrier layer 4 is roughly formed to fit the interface of the barrier layer 4, i.e., to include a plurality of recesses $b_2$ receiving the protuberances $a_1$ of the barrier layer 4 and a plurality of protuberances $a_2$ received by the recesses $b_1$ of the barrier layer 4.

The ratio Ry/t of the maximum height Ry of the protuberance $a_1$ at the interface of the barrier layer 4 to the thickness t of the barrier layer 4 is set to be $Ry/t \geqq 0.1$.

In a preferred embodiment, the layers of the thermoelectric material 1 are formed by sputtering which is a generally employed method of forming thin layers.

When the barrier layer 4 made of the second semiconductor $s_2$ is formed on the substrate 2 by sputtering, a plurality of protuberances $a_1$ made of the second semiconductor $s_2$ are formed on the surface of the barrier layer 4 and a plurality of recesses $b_1$ where no second semiconductor $s_2$ exists are formed in the surface of the barrier layer 4, due to uneven growth of crystals and surface diffusion in the initial stage of forming the barrier layer 4.

Next, when the conductive layer 3 made of the first semiconductor $s_1$ is formed on the surface of the barrier layer 4, the protuberances $a_1$ are covered with the first semiconductor $s_1$ to form recesses $b_2$ and the recesses $b_1$ are filled with the first semiconductor $s_1$ to form protuberances $a_2$. Therefore, a plurality of protuberances $a_2$ made of the first semiconductor $s_1$ are formed on the surface of the conductive layer 3 and a plurality of recesses $b_2$ where no first semiconductor $s_1$ exists are formed in the surface of the conductive layer 3.

It is believed that the below-mentioned phenomenon takes place when the heterojunction interface is created by forming the conducting layer 3 on the barrier layer 4.

Figure 2:
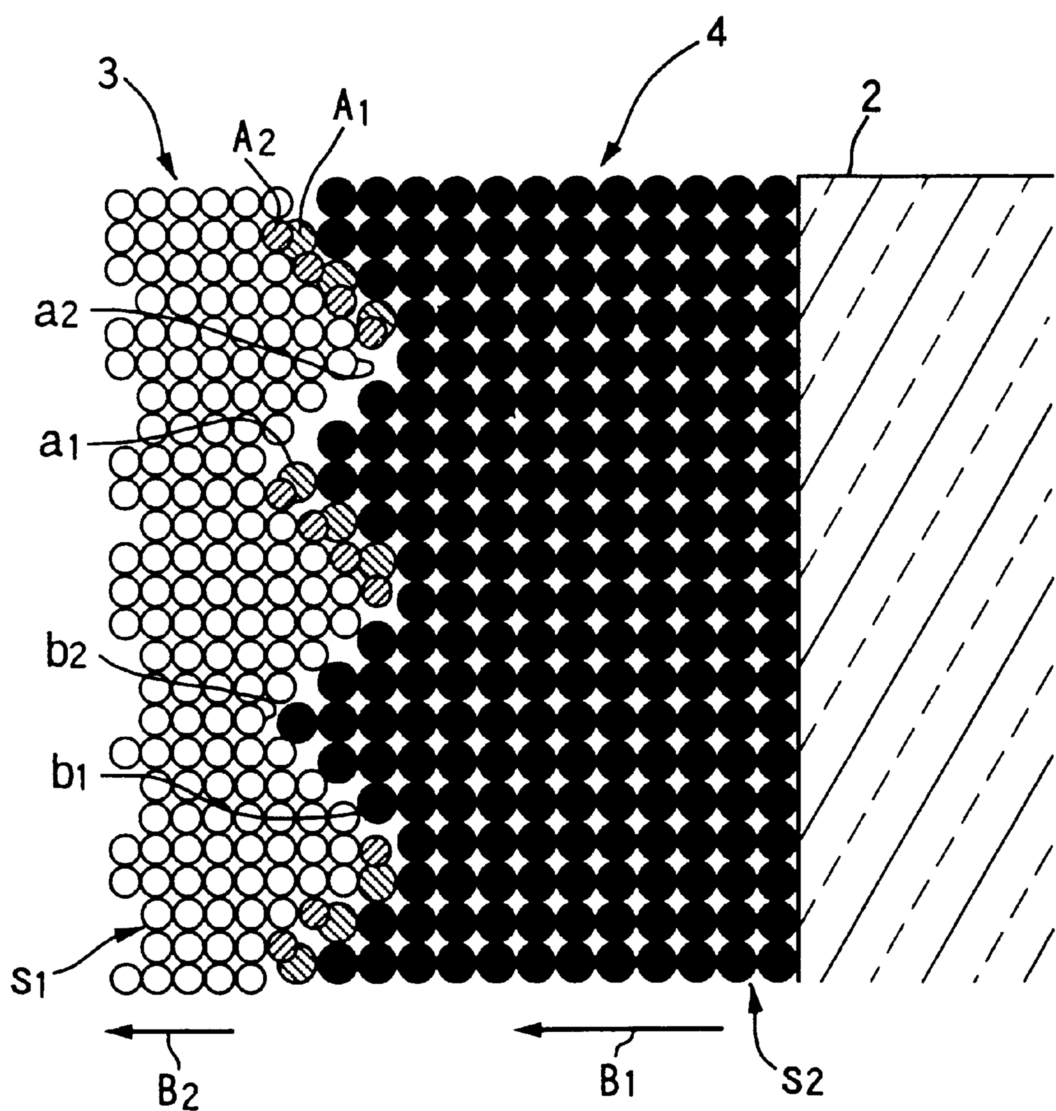
FIG. 2 is an explanatory view showing a first example of a step of forming the layers of the material of FIG. 1.

That is, as illustrated in FIG. 2, the crystals in the conductive layer 3 tend to grow in the crystal orientation $B_2$ which is the same as the crystal orientation $B_1$ of the barrier layer 4. In the recesses and protuberances $b_1$, $b_2$, $a_1$, and $a_2$ shown in FIG. 2, therefore, an atom $A_1$ on the barrier layer 4 side tends to overlap with an atom $A_2$ on the conductive layer 3 side as shown by the lined circles. Actually, however, it is impossible for the atoms to overlap with each other. Therefore, the two atoms $A_1$ and $A_2$ move to neutral positions where they do not overlap with each other, and other surrounding atoms undergo displacement, too. Thus, strain of the order of atoms occurs in the crystalline structure at the heterojunction interface between the barrier layer 4 and the conductive layer 3, and atoms are restricted at the heterojunction interface. That is, even when an external force acts on the heterojunction interface between the barrier layer 4 and the conductive layer 3, the atoms hardly move at the heterojunction interface. This means that the interfacial strength is enhanced between the barrier layer 4 and the conductive layer 3.

Therefore, if the ratio Ry/t of the maximum height Ry of the protuberance $a_1$ of the barrier layer 4 to the thickness t of the barrier layer 4 is set to be $Ry/t \geqq 0.1$, it is possible to increase the strain and to sufficiently enhance the interfacial strength.

When the next barrier layer 4 is formed on the surface of the conductive layer 3, the interface of the barrier layer 4 relative to the conductive layer 3 is roughly formed to include a plurality of protuberances $a_1$ and a plurality of recesses $b_1$ in the same manner as described above. It is therefore considered that the same phenomenon as the one mentioned above takes place between the conductive layer 3 and the barrier layer 4. The step of forming the layer is repeated and, lastly, the barrier layer 4 made of the second semiconductor $s_2$ is formed.

Even when used at high temperatures, the thermoelectric material 1 provided in accordance with the present invention overcomes a relatively large thermal stress that generates at the heterojunction interface, and exhibits an excellent thermoelectric performance.

It is further believed that in the thermoelectric material provided in accordance with the present invention, it is possible to expand the temperature range toward the higher temperature side in order to broaden an optimum range of temperatures at which the thermoelectric material is used.

More specifically, it is believed that the composition in the interfacial region including recesses and protuberances is an average mixture composition of the conductive layer composition and the barrier layer composition. It is therefore considered that potential energy is newly produced in the interfacial region in the electron band structure. The quantization level in the ground state corresponding to the new potential energy is different from the quantization level in the ground state of the conductive layer, and the temperature range in which the carriers are thermally excited due to the presence of these two quantization levels is expanded toward the higher temperature side, by a degree corresponding to the presence of the quantization level in the ground state of the interfacial region, compared to the case where there exists only the quantization level in the ground state of the conductive layer.

Moreover, it is believed that the thermoelectric material exhibits enhanced thermoelectric performance on account of the reasons described below.

That is, the heat conduction of the semiconductor depends chiefly upon the lattice vibration. At the semiconductor interface, the lattice vibration receives interference of the interface, and the heat conductivity decreases. When both interfaces of the barrier layer and the conductive layer are roughly formed to include a plurality of recesses and protuberances, the contact area of the interface can be increased to become larger than that of a flat interface, whereby interference of the interface with the lattice vibration is enhanced to further decrease the heat conductivity. The performance index which is one of the factors expressing thermoelectric performance varies in reverse proportion to the heat conductivity. By permitting the heat conductivity to greatly decrease, as described above, it is possible to improve the thermoelectric performance of the thermoelectric material.

Although a variety of materials may be used for the substrate and to form the first and second semiconductors, examples of preferred materials are noted below.

Specifically, the substrate 2 can be a glass for semiconductor substrate, a silicon wafer, a ceramic wafer or a high molecular film.

Examples of the first semiconductor $s_1$ of which the conductive layer 3 is made, include p-type semiconductors such as $Fe_{0.9}Mn_{0.1}Si_2$[$FeSi_2$ semiconductor], $(Si_{0.8}Ge_{0.2})B_{0.003}$ [SiGe semiconductor], $(PbTe_{0.95}Se_{0.05})Na_{0.01}$ [PbTe semiconductor], and $(GeTe)_{0.85}(AgSbTe_2)_{0.15}$ [PbTe substituted semiconductor], n-type semiconductors such as $Fe_{0.9}Co_{0.1}Si_2$ [$FeSi_2$semiconductor], $(Si_{0.8}Ge_{0.2})$ $P_{0.002}$ [SiGe semiconductor], $(Pb_{0.95}Ge_{0.05}Te)$ $(PbI_2)_{0.001}$ [PbTe semiconductor], and p-type and n-type BiTe semiconductors.

Examples of the second semiconductor $s_2$ of which the layer 4 is made, include Si, $FeSi_2$ [$FeSi_2$semiconductor], $Si_{0.8}Ge_{0.2}$ [SiGe semiconductor] and $(Pb_{0.9}Eu_{0.07})Te$ [PbTe semiconductor].

In carrying out the sputtering, the inside of the chamber is evacuated to about $10_{-3}$ Torr and is replaced with an argon gas. After the flow rate of argon gas is adjusted, in accordance with conventional methods, the electric discharge is started. During the discharge, the flow rate of argon gas is set at 5 to 25 SCCM (SCCM: mass flow rate), the electric power for sputtering is set at 50 to 500 watts, and the sputtering rate is set at 10 to 300 Å/second.

In accordance with the present invention, the conductive layers 3 and the barrier layers 4 are controlled to have predetermined thicknesses according to the sputtering rate and the sputtering time.

The heights of the protuberances $a_1$, $a_2$ at the interface vary depending upon the thickness of the barrier layer 4 which is the first layer on the substrate 2, and increase with an increase in the thickness of the barrier layer 4. The heights of the protuberances $a_1$, $a_2$ of the layers 3 and 4 that are subsequently formed are maintained. The heights of the protuberances $a_1$, $a_2$ can also be controlled depending upon the surface roughness of the substrate 2 and the sputtering conditions.

An Example will now be described.

Table 1 shows the conditions under which a thermoelectric material 1 is produced, and under which Examples 1 and 2 were conducted while changing the thickness of the barrier layer 4.

TABLE 1

| | | |
|---|---|---|
| Substrate | glass for semiconductor substrate, substrate temp.: room temp. | |
| Conditions inside the chamber | Pressure: $5 \times 10^{-3}$ Torr, argon gas atmosphere | |
| Discharging conditions | argon gas flow rate: 15 SCCM, sputtering power: 100 watts, sputtering rate: 10Å/sec. | |
| | Material | Number of layers |
| Conductive layer | $(Si_{0.8}Ge_{0.2})B_{0.003}$ | 100 |
| Barrier layer | Si | 101 |

For comparison, Comparative Example having the same materials for barrier layers and conductive layers as those of Examples 1 and 2 was produced by a molecular beam epitaxial method (MBE).

Table 2 shows the roughness at the interfaces of the barrier layers 4, the thicknesses t of the barrier layers 4 and of the conductive layers 3, and the ratio Ry/t of the maximum height Ry of the protuberance $a_1$ of the barrier layer 4 to the thickness t of the barrier layer 4 in Examples 1 and 2 and in the Comparative Example.

TABLE 2

| | Roughness of interface of barrier layer | | Thickness | | |
|---|---|---|---|---|---|
| | Ave. roughness Ra (Å) | Max. height of protuberance Ry (Å) | Conductive Layer (Å) | Barrier Layer t (Å) | Ratio Ry/t |
| Example 1 | 2.0 | 16.0 | 50 | 50 | 0.32 |
| Example 2 | 7.1 | 55.0 | 50 | 500 | 0.11 |
| Comparative Example | 0.1 | 1.0 | 50 | 50 | 0.02 |

Figure 3:
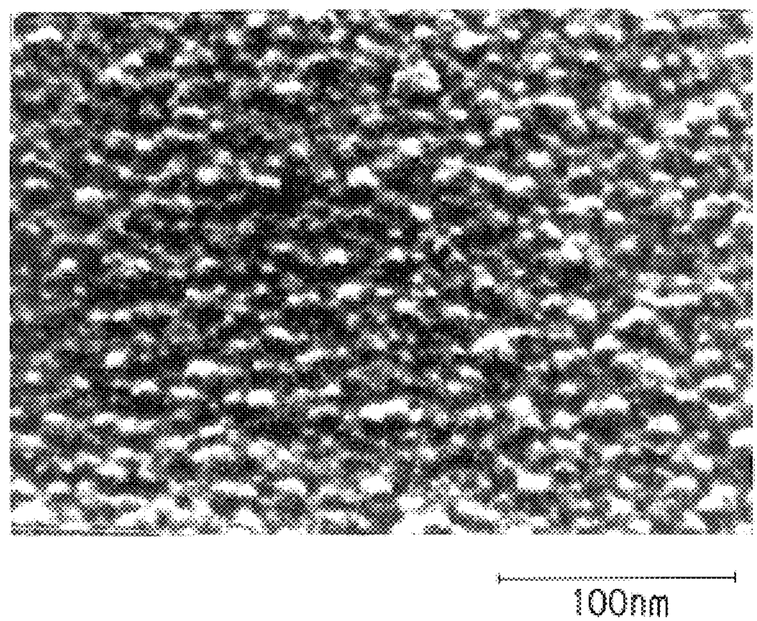
FIG. 3 is a microphotograph of a first example of an interface of a very thin film-like barrier layer.
Figure 4:
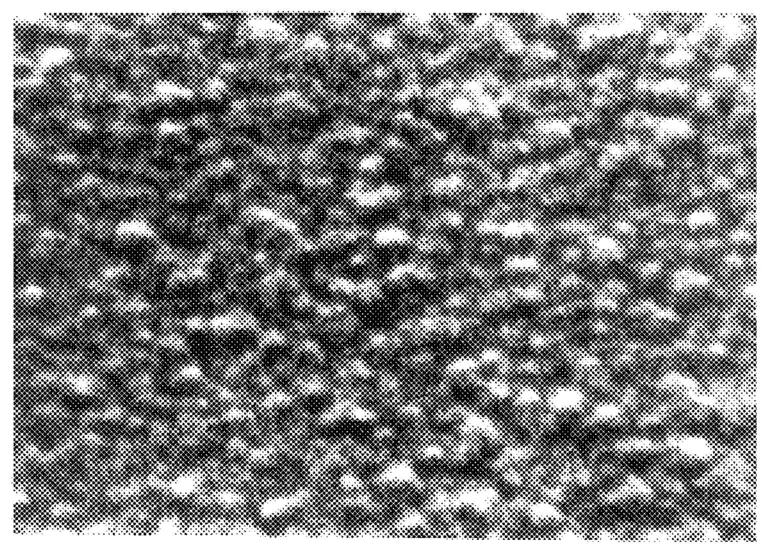
FIG. 4 is a microphotograph of a second example of an interface of a very thin film-like barrier layer.
Figure 5:
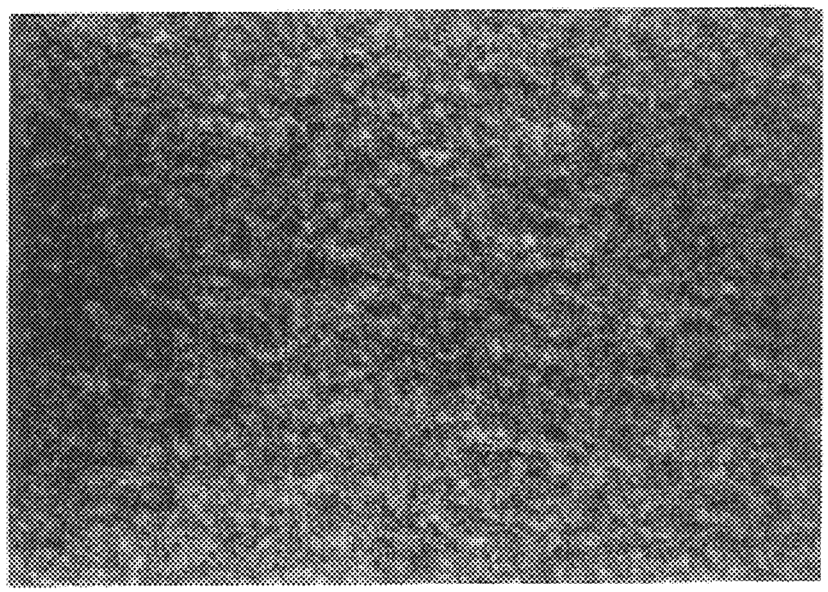
FIG. 5 is a microphotograph of a third example of an interface of a very thin film-like barrier layer.

FIGS. 3, 4 and 5 are microphotographs of the interfaces of fiftieth barrier layers 4 of Examples 1, 2 and Comparative Example, obtained by using a field-emission scanning electron microscope (FE-SEM). It will be understood from these microphotographs that the order of relative surface roughnesses of Examples 1, 2 and Comparative Example is Example 2>Example 1>Comparative Example.

Figure 6:
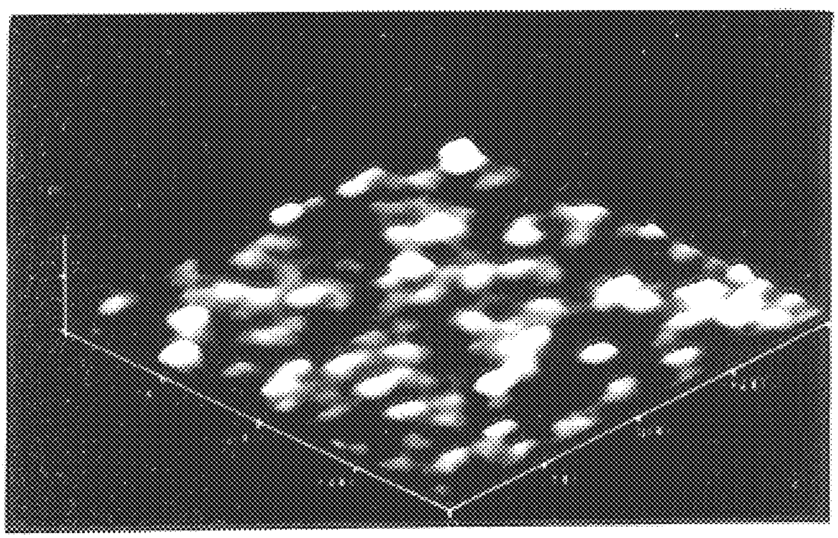
FIG. 6 is a microphotograph showing the roughness of the interface of the first example of the very thin film-like barrier layer illustrated in FIG. 3.
Figure 7:
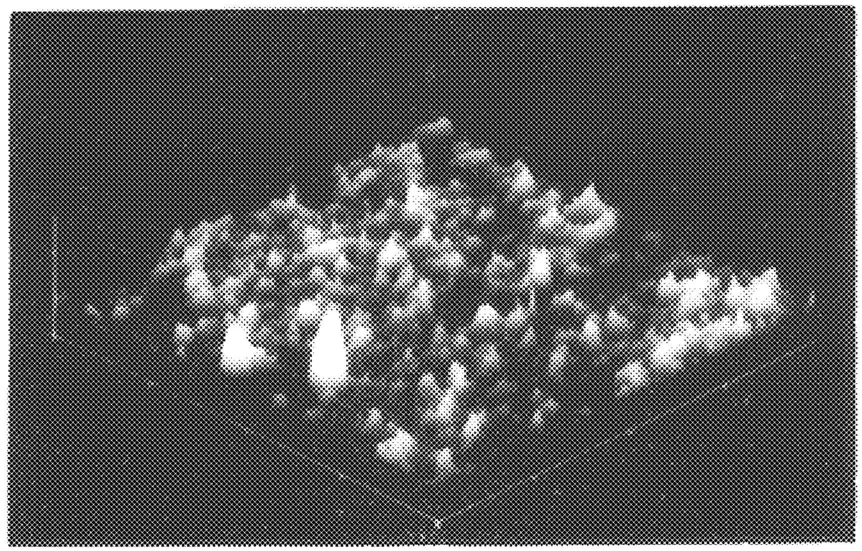
FIG. 7 is a microphotograph showing the roughness of the interface of the second example of the very thin film-like barrier layer illustrated in FIG. 4.
Figure 8:
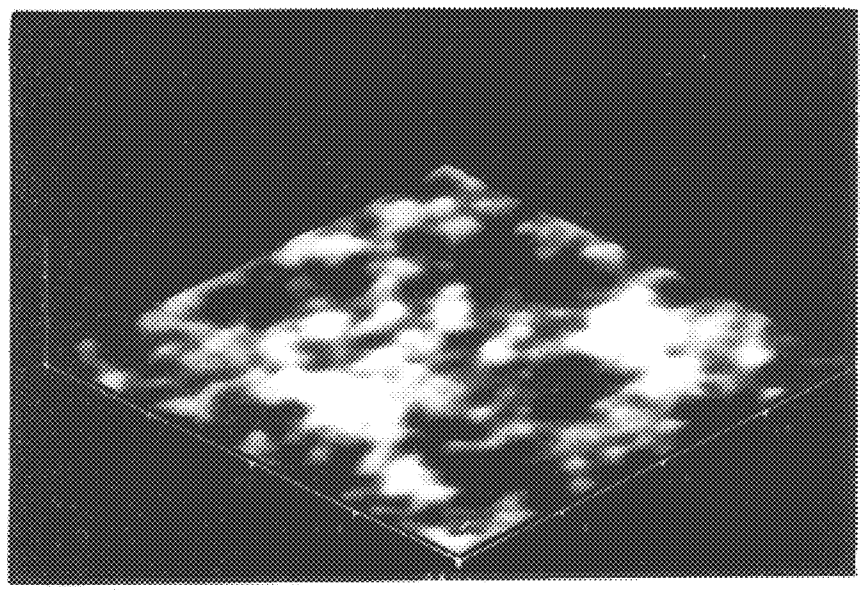
FIG. 8 is a microphotograph showing the roughness of the interface of the third example of the very thin film-like barrier layer illustrated in FIG. 5.

FIGS. 6, 7 and 8 are microphotographs showing the roughnesses at the interfaces of the fiftieth barrier layers 4 of Examples 1, 2 and Comparative Example, obtained by using an atomic force microscope (AFM). The surface roughnesses of Examples 1, 2 and the Comparative Example were calculated by measuring the roughnesses at the interfaces of the barrier layers over an area of about 1 μm long and about 1 μm wide, using an atomic force microscope, and making reference to JIS B0601 (1994) which specifies the surface roughness.

Then, thermoelectric outputs and electric conductivities of Examples 1, 2 and the Comparative Example were measured by the methods described below.

Electrodes were attached to both film-forming surfaces c (FIG. 1 shows only one film-forming surface) of Examples 1, 2 and the Comparative Example. The electrode of one side was heated at 300° C. by using an infrared ray heater, the electrode of the other side was maintained at room temperature to create a temperature gradient, and the thermoelectric output generated across the two electrodes was measured. The temperatures of the two electrodes were controlled by using thermocouples. The electric conductivity was measured by the known four-terminal method.

Thereafter, a heat-cycle test was conducted for the Examples 1, 2 and Comparative Example. During this test, the surfaces of the outermost barrier layers 4 were visually observed and the thermoelectric outputs and the electric conductivities were measured by the same methods as those mentioned above.

In the heat-cycle testing, Examples 1, 2 and the Comparative Example were heated at 500° C. for one hour, and were left to naturally cool down to room temperature to complete one cycle. This cycle was repeated.

Table 3 shows the results of heat-cycle test together with thermoelectric performance of Examples 1, 2 and the Comparative Example before the heat-cycle test was conducted. In Table 3, "broken" refers to a state where cracks are spreading into the interior.

TABLE 3

| | Number of cycles of heat-cycle testing | Surface state | Thermoelectric performance | |
|---|---|---|---|---|
| | | | Thermo-electric output (W) | Electric conductivity σ (S/m) |
| Example 1 | — | — | 8.0 | 39000 |
| | 10 | normal | 8.1 | 39000 |
| | 100 | normal | 8.0 | 40000 |
| Example 2 | — | — | 8.2 | 39000 |
| | 10 | normal | 8.0 | 39000 |
| | 100 | normal | 8.2 | 38000 |
| Comparative | — | — | 8.1 | 40000 |
| Example | 10 | cracks occurred | 1.5 | 15000 |
| | 100 | broken | — | — |

As can be seen from Table 3, Examples 1 and 2 exhibit favorable heat resistances and excellent thermoelectric performances, even at high temperatures.

In forming the layers by sputtering, when the crystals are grown on the conductive layer 3 (or on the barrier layer 4) in the crystal orientation $B_2$ which is the same as the crystal orientation $B_1$ of the barrier layer 4 (or the conductive layer 3), it is considered that the following phenomenon takes place, resulting from the creation of the heterojunction interface.

Figure 9:
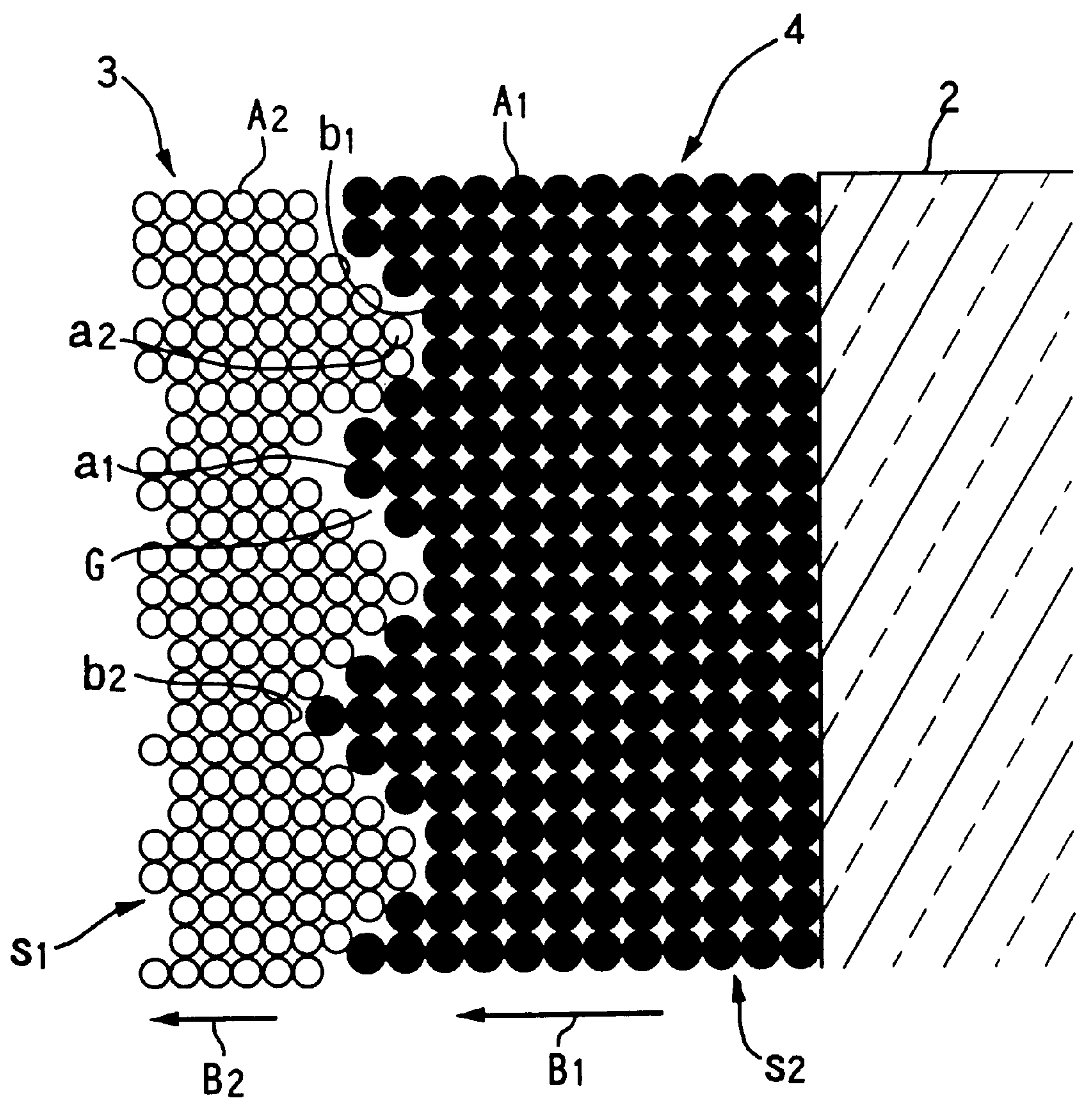
FIG. 9 is an explanatory view showing a second example of a step of forming layers in a thermoelectric material.

That is, when atoms $A_1$ in the barrier layer 4 (or conductive layer 3) and atoms $A_2$ in the conductive layer 3 (or barrier layer 4) are arranged in a stable state, from the standpoint of energy, in recesses and protuberances $b_1$, $b_2$, $a_1$and $a_2$, there are no atoms in the region where atoms would overlap with each other. Therefore, a plurality of gaps G of the order of atoms occur in the crystalline structure as shown in FIG. 9. That is, when an external force acts on the heterojunction interface between the barrier layer 4 and the conductive layer 3, atoms in the interfacial region easily move. This means that the deformation performance is enhanced at the heterojunction interface between the barrier layer 4 and the conductive layer 3.

Therefore, when the ratio Ry/t of the maximum height Ry of the protuberance $a_1$ of the barrier layer 4 to thickness t of the barrier layer is set to be Ry/t≧0. 1, it is possible to reliably form the gaps G and to sufficiently enhance the deformation performance.

Figure 10:
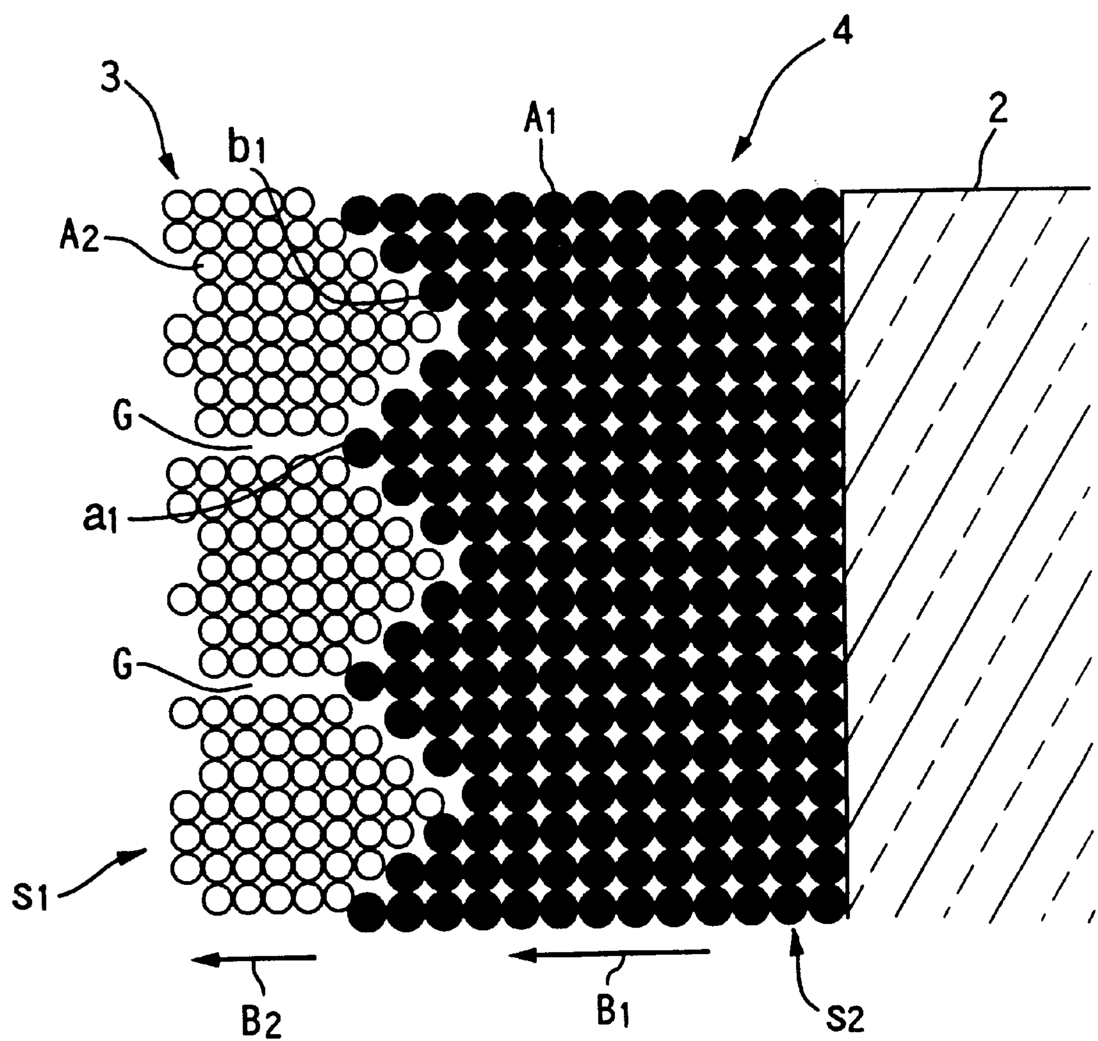
FIG. 10 is an explanatory view showing a third example of a step of forming layers in a thermoelectric material.

FIG. 10 illustrates a state where atoms $A_2$ in the conductive layer 3 are densely arranged following the outward form of the recesses $b_1$ in the barrier layer 4 in case where the crystal orientations $B_1$, $B_2$ of the barrier layer 4 and the conductive layer 3 are in agreement with each other and the heterojunction interface is created. When atoms $A_2$ are arranged as described above, a plurality of gaps G are formed in the conductive layer 3 in parallel with the crystal orientation $B_2$ of the conductive layer 3. The gaps G are formed even in the plurality of barrier layers 4 and in the plurality of conductive layers 3 that are alternatingly formed on the conductive layer 3.

Figure 11:
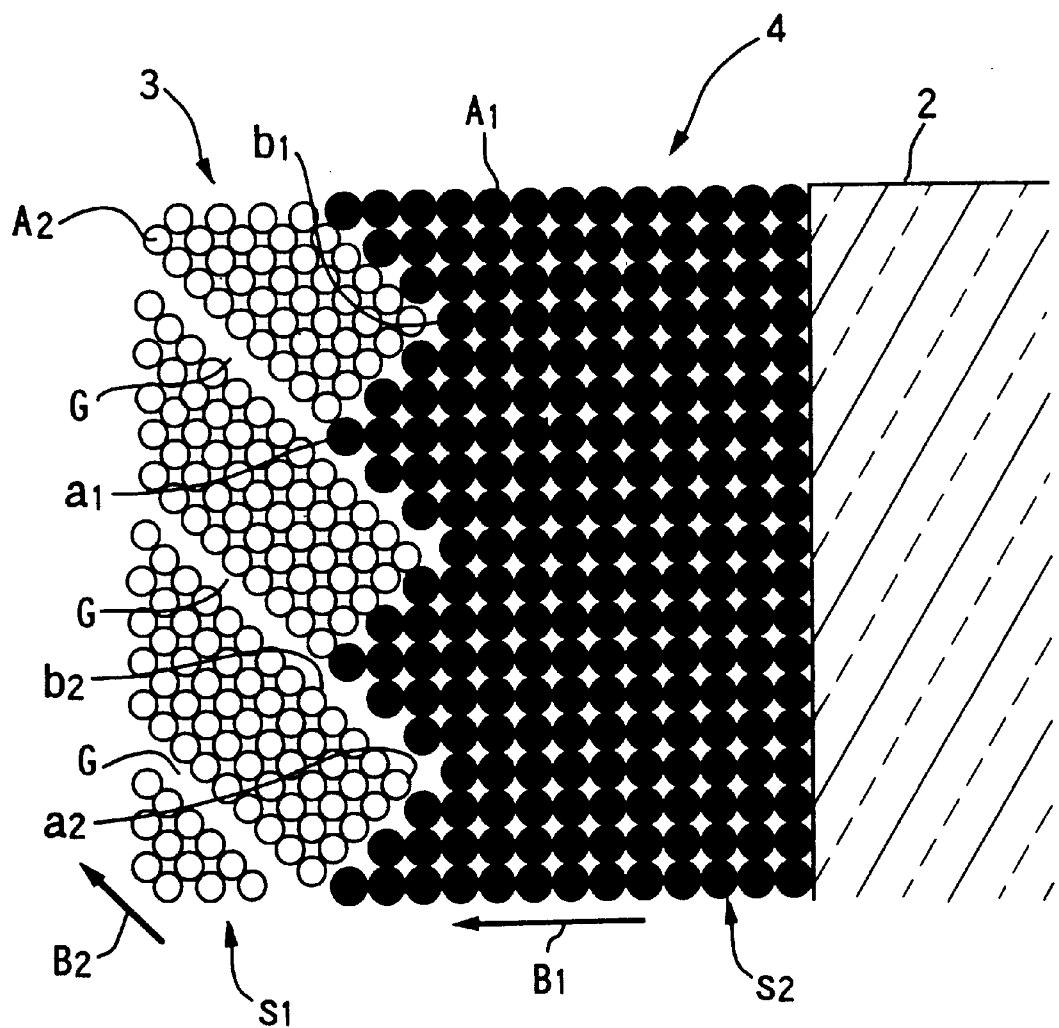
FIG. 11 is an explanatory view showing a fourth example of a step of forming layers in a thermoelectric material.

FIG. 11 illustrates a state where atoms $A_2$ in the conductive layer 3 are densely arranged following the outward form of the recesses $b_1$ in the barrier layer 4 in case where the crystal orientation $B_2$ of the conductive layer 3 is tilted relative to the crystal orientation $B_1$ of the barrier layer 4 and the heterojunction interface is created. When atoms $A_2$ are arranged in this way, a plurality of gaps G are formed in the conductive layer 3 in parallel with the crystal orientation $B_2$ of the conductive layer 3. Such gaps G are formed even in the plurality of barrier layers 4 and in the plurality of conductive layers 3 that are alternatingly formed on the conductive layer 3.

A thermoelectric material which exhibits an excellent thermoelectric performance even when it is used at high temperatures, and that can be produced at a low cost, has been shown and described. From the foregoing, it will be appreciated that although embodiments of the invention have been described herein for purposes of illustration, various modifications may be made without deviating from the spirit of the invention. Thus, the present invention is not limited to the embodiments described herein, but rather is defined by the claims which follow.

I claim:

1. A thermoelectric material comprising:

a plurality of barrier layers and a plurality of conductive layers that are alternatingly formed one upon the other, and wherein an interface of the barrier layer relative to the conductive layer is provided with a plurality of protuberances and a plurality of recesses, an interface of the conductive layer relative to the barrier layer is roughly formed to fit the interface of the barrier layer, and the ratio Ry/t of a maximum height Ry of the protuberances on the barrier layer to a thickness t of the barrier layer is Ry/t≧0. 1.

2. The thermoelectric material according to claim 1 wherein the conductive layers are made of a first semiconductor and the barrier layers are made of a second semiconductor that is different from the first semiconductor.

3. The thermoelectric material according to claim 2 wherein the first semiconductor is one selected from the group including $FeSi_2$ semiconductor, SiGe semiconductor, PbTe semiconductor and BiTe semiconductor, and the second semiconductor is one selected from the group including Si, $FeSi_2$ semiconductor, SiGe semiconductor and PbTe semiconductor.

* * * * *

UNITED STATES PATENT AND TRADEMARK OFFICE

CERTIFICATE OF CORRECTION

PATENT NO. : 5,922,988

DATED : July 13, 1999

INVENTOR(S) : Seiji Nishimoto

It is certified that error appears in the above-identified patent and that said Letters Patent is hereby corrected as shown below:

In the Abstract:

Line 14, please change " $\geqq$ " to -- ≥ --.

Column 1, line 65, please change " $\geqq$ " to -- ≥ --.

Column 2, line 28, please change " $\geqq$ " to -- ≥ --.

Column 3, line 22, please change " $\geqq$ " to -- ≥ --.

Column 4, line 3, please change " $\geqq$ " to -- ≥ --.

Column 5, line 20, please change "$10_{-3}$" to -- $10^{-3}$ --.

Column 5, line 51, please move "chamber" up under "Conditions inside the".

UNITED STATES PATENT AND TRADEMARK OFFICE

CERTIFICATE OF CORRECTION

PATENT NO. : 5,922,988

DATED : July 13, 1999

INVENTOR(S) : Seiji Nishimoto

It is certified that error appears in the above-identified patent and that said Letters Patent is hereby corrected as shown below:

Column 6, line 10, please move "Thickness" up adjacent to "of barrier layer".

Column 7, line 44, please change " $\geqq$ " to -- ≥ --.

Column 8, line 40, please change " $\geqq$ " to -- ≥ --.

Signed and Sealed this

Eighth Day of May, 2001

Attest:

NICHOLAS P. GODICI

*Attesting Officer* *Acting Director of the United States Patent and Trademark Office*